(12) United States Patent
Chien et al.

(10) Patent No.: US 6,213,796 B1
(45) Date of Patent: Apr. 10, 2001

(54) EJECTOR MECHANISM FOR DISENGAGING AN ELECTRONIC DEVICE FROM AN ELECTRICAL CONNECTOR ON A CIRCUIT BOARD

(75) Inventors: Chung-Chi Chien; Po-An Lin, both of Taipei (TW)

(73) Assignee: Compal Electronics, INC, Taipei (JP)

( * ) Notice: Subject to any disclaimer, the term of this patent is extended or adjusted under 35 U.S.C. 154(b) by 0 days.

(21) Appl. No.: 09/499,039

(22) Filed: Feb. 7, 2000

(51) Int. Cl.$^7$ ..................................................... H01R 13/62
(52) U.S. Cl. ........................................... 439/160; 439/152
(58) Field of Search ................................................ 439/160

(56) References Cited

U.S. PATENT DOCUMENTS

| | | | |
|---|---|---|---|
| 5,634,815 | * 6/1997 | Inazuka | 439/160 |
| 5,793,607 | * 8/1998 | Karidis et al. | 439/160 |
| 5,946,196 | * 8/1999 | Baek | 439/160 |
| 5,971,780 | * 10/1999 | Youn | 439/160 |

* cited by examiner

Primary Examiner—Neil Abrams
Assistant Examiner—Phuong KT Dinh
(74) Attorney, Agent, or Firm—Pillsbury Winthrop LLP

(57) ABSTRACT

An ejector mechanism is provided for pulling an electrical mating end portion of an electronic device in a first direction away from an electrical connector that is provided on a circuit board. The ejector mechanism includes a base member adapted for retaining the electronic device thereon and having a rear end formed with an upwardly extending engaging flange that extends in a second direction transverse to the first direction, a cover member disposed above the base member and cooperating with the base member so as to confine the electronic device therebetween, and an elongated operating member extending in the second direction. The cover member has a pivot portion disposed above the engaging flange. The operating member is mounted pivotally on the pivot portion about a pivot axis, and has a hook projection which defines a downwardly opening engaging groove for receiving the engaging flange therein. The operating member is rotatable about the pivot axis to enable the hook projection to apply a pulling force in the first direction at the engaging flange, thereby resulting in corresponding movement of the base member in the first direction so as to disengage the electrical mating end portion of the electronic device from the electrical connector.

5 Claims, 3 Drawing Sheets

EJECTOR MECHANISM FOR DISENGAGING AN ELECTRONIC DEVICE FROM AN ELECTRICAL CONNECTOR ON A CIRCUIT BOARD

BACKGROUND OF THE INVENTION

1. Field of the Invention

The invention relates an ejector mechanism for disengaging an electronic device from an electrical connector on a circuit board, more particularly to an ejector mechanism which is easily operable to disengage an electronic device from an electrical connector on a circuit board in order to facilitate replacement of the electronic device.

2. Description of the Related Art

A circuit board in a computer housing is usually mounted with a plurality of electronic devices for performing different functions. Each of the electronic devices has an electrical mating end portion which is connected to a corresponding electrical connector provided on the circuit board. Typically, the engagement between the electrical mating end portion of the electronic device and the electrical connector is relatively tight so as to ensure stable electrical connection therebetween. Clearances formed among adjacent ones of the electronic devices are usually relatively small. When it is desired to remove one of the electronic devices from the circuit board, such as for replacement with a new one, it is relatively difficult for a person to apply a pulling force to disengage the electronic device from the corresponding electrical connector. It is very likely that an adjacent one of the electronic devices will be accidentally damaged during the detachment operation.

SUMMARY OF THE INVENTION

Therefore, the main object of the present invention is to provide an ejector mechanism which is easily operable to disengage an electronic device from an electrical connector on a circuit board without damaging an adjacent electronic device to facilitate replacement.

Accordingly, the ejector mechanism of the present invention is adapted for pulling an electrical mating end portion of an electronic device in a first direction away from an electrical connector that is provided on a circuit board. The ejector mechanism includes a base member adapted for retaining the electronic device thereon, a cover member which is disposed above the base member and which cooperates with the base member so as to confine the electronic device therebetween, and an elongated operating member. The base member has a rear end distal to the electrical mating end portion of the electronic device in the first direction and formed with an upwardly extending engaging flange that extends in a second direction transverse to the first direction. The cover member has a pivot portion disposed above the engaging flange. The operating member extends in the second direction, and is mounted pivotally on the pivot portion of the cover member about a pivot axis. The operating member has a hook projection which defines a downwardly opening engaging groove for receiving the engaging flange therein. The operating member is rotatable about the pivot axis to enable the hook projection to apply a pulling force in the first direction at the engaging flange, thereby resulting in corresponding movement of the base member in the first direction so as to be adapted to disengage the electrical mating end portion of the electronic device from the electrical connector on the circuit board.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
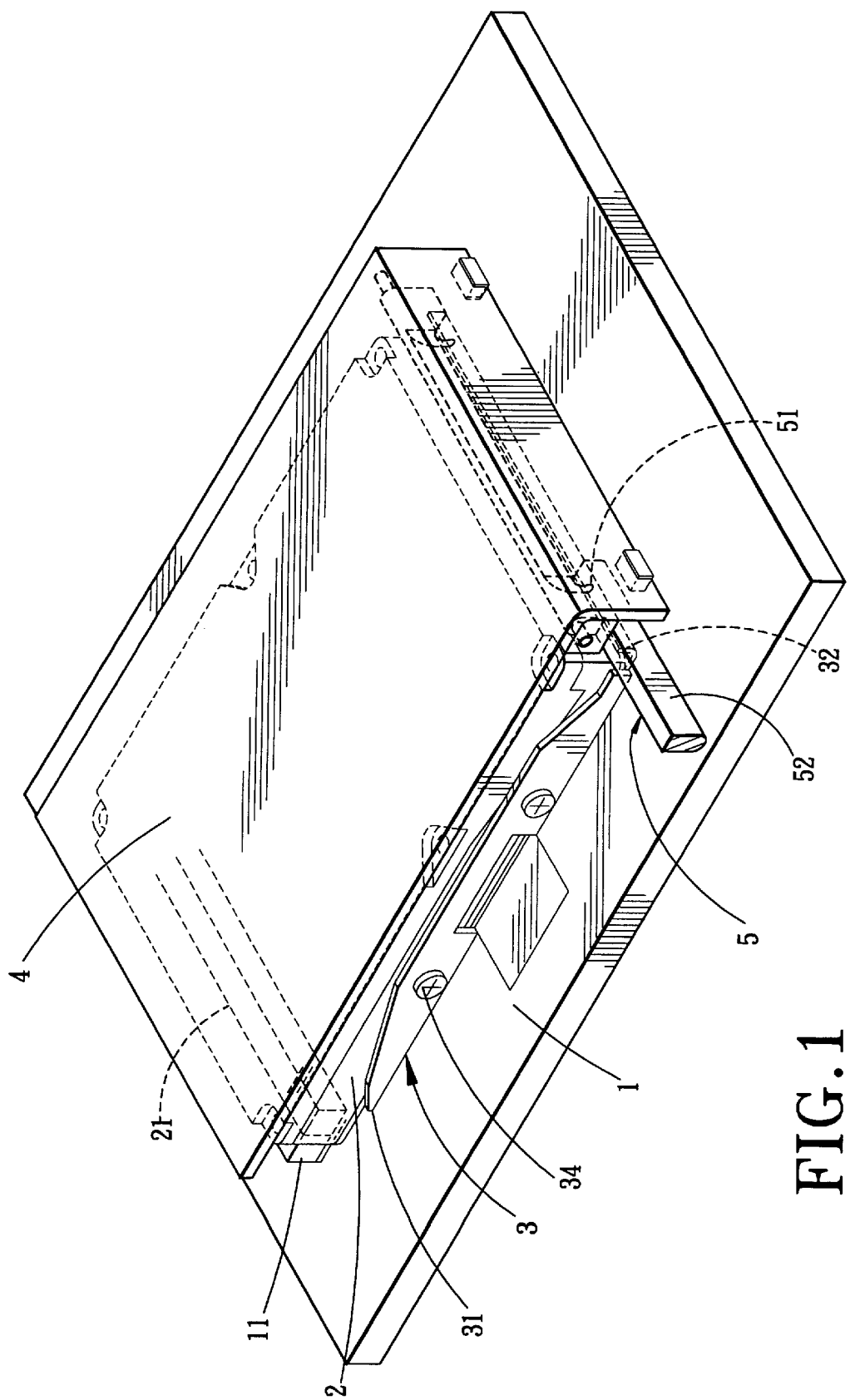
FIG. 1 is a perspective view of a preferred embodiment of the ejector mechanism of the present invention in an assembled state.
Figure 2:
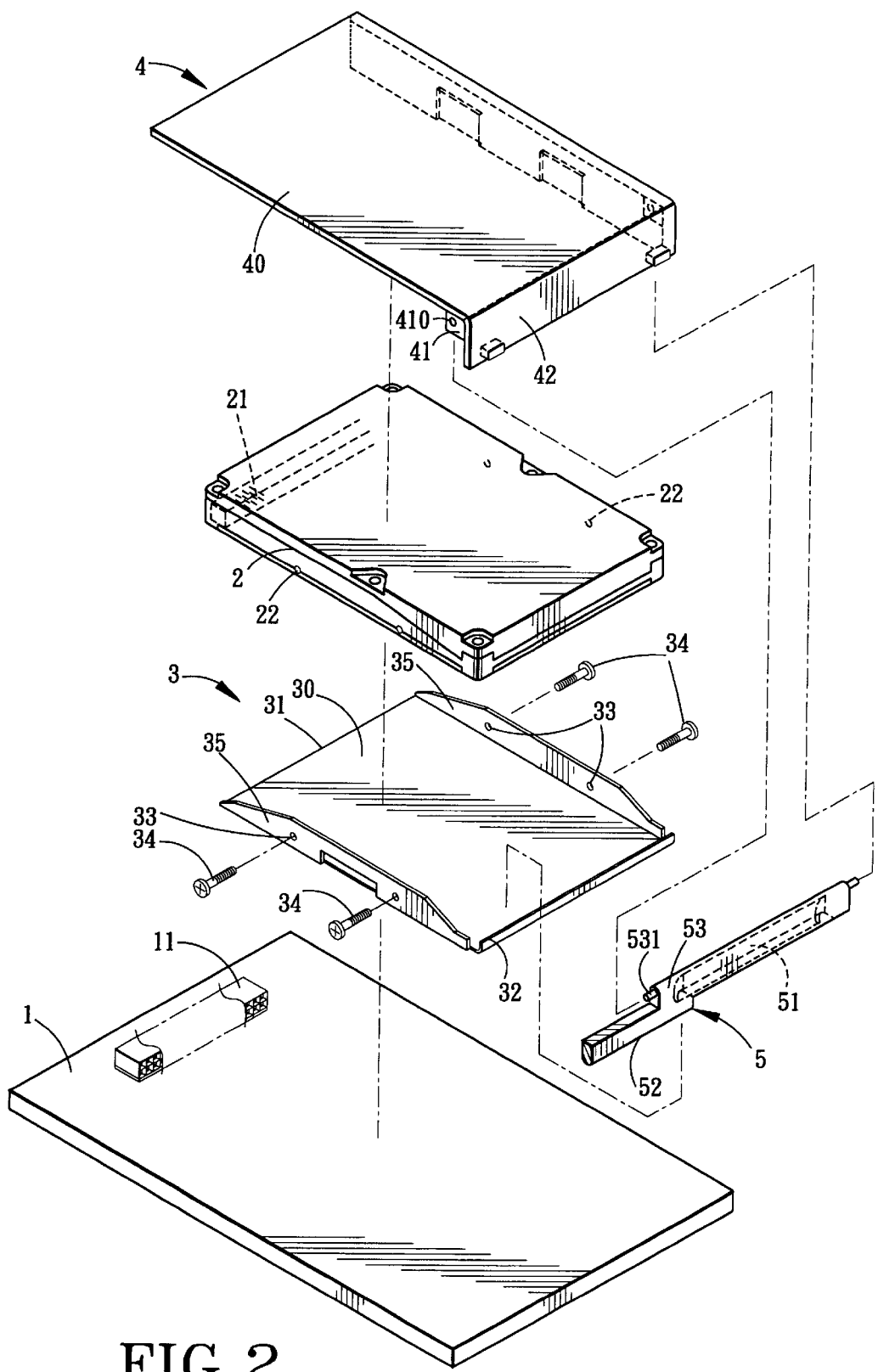
FIG. 2 is an exploded perspective view of the preferred embodiment.

Referring to FIGS. 1 and 2, the preferred embodiment of the ejector mechanism of this invention is adapted to be mounted on a circuit board 1 for disengaging an electronic device 2 from an electrical connector 11 provided on the circuit board 1. The electronic device 2 has an electrical mating end portion 21 mating with and connected to the electrical connector 11, and opposite lateral sides formed with screw holes 22.

The ejector mechanism of the preferred embodiment is shown to include a base member 3, a cover member 4 and an elongated operating member 5.

The base member 3 has a base plate 30 adapted for seating of the electronic device 2 thereon and a pair of upwardly extending lateral walls 35 that extend respectively from opposite lateral edges of the base plate 30 and that are formed with fastener holes 33 adapted to be aligned respectively with the screw holes 22 in the electronic device 2. Screw fasteners 34 are extended through the fastener holes 33 in the base member 3 and into the screw holes 22 in the electronic device 2 for engaging the electronic device 2 so as to retain the electronic device 2 on the base member 3. The base plate 30 has a front end 31 to be disposed rearward of and proximate to the electrical mating end portion 21 of the electronic device 2, and a rear end which is distal to the electrical mating end portion 21 of the electronic device 2 in a longitudinal first direction and which is formed with an upwardly extending engaging flange 32 that extends in a second direction transverse to the first direction.

The cover member 4 is disposed above the base member 3, and cooperates with the base member 3 so as to confine the electronic device 2 therebetween. The cover member 4 has a cover plate 40, a support wall 42 extending downwardly from a rear end of the cover plate 40 and adapted for seating on the circuit board 1, and a pair of pivot lobes 41 extending downwardly from the rear end of the cover plate 40 and disposed adjacent to the support wall 42. The pivot lobes 41 are spaced apart in the second direction, and are disposed above the engaging flange 32 of the base member 3. The pivot lobes 41 are formed with aligned pivot holes 410. The pivot lobes 41 serve as a pivot portion with a pivot axis which extends in the second direction through the aligned pivot holes 410.

The operating member 5 includes a pivot shaft 53 extending along the second direction, a hook projection 51 projecting forwardly and downwardly from the pivot shaft 53, and an operating lever 52 extending along the second direction and connected to the pivot shaft 53. The pivot shaft 53 has opposite ends 531 extending through the pivot holes 410 in the pivot lobes 41 for mounting pivotally on the pivot lobes 41. The hook projection 51 defines a downwardly opening engaging groove 55 for receiving the engaging flange 32 therein. The operating lever 52 is disposed outwardly of the cover member 4 to permit operation thereof. When the electronic device 2 is disposed on the base plate 30, a sufficient space should be formed between the electronic device 2 and the support wall 42 of the cover member 4 to permit pivoting movement of the operating member 5 about the pivot axis.

Figure 3:
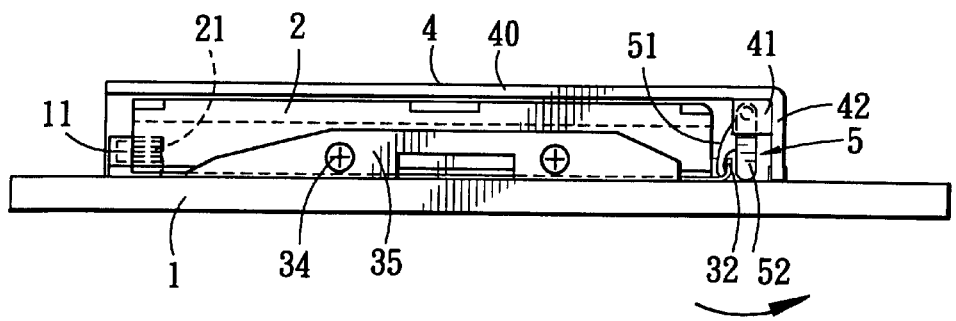
FIG. 3 is a side view of the preferred embodiment.
Figure 4:
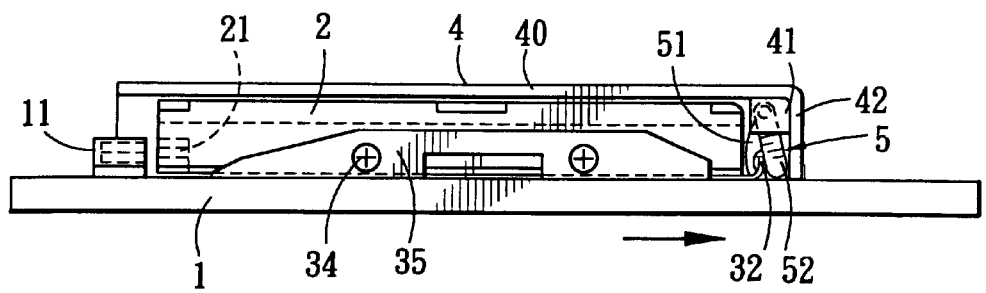
FIG. 4 is a side view of the preferred embodiment when the ejector mechanism is operated.

Referring to FIGS. 3 and 4, when it is desired to disengage the electrical mating end portion 21 of the electronic device 2 from the electrical connector 11 provided on the circuit board 1, the operating lever 52 is operated to rotate the operating member 5 in a counter-clockwise direction about the pivot axis. At this time, the hook projection 51 engages the engaging flange 32 and applies a rearward pulling force in the first direction at the engaging flange 32, thereby resulting in corresponding rearward movement of the base member 3 in the first direction so as to disengage the electrical mating end portion 21 of the electronic device 2 from the electrical connector 11. The electronic device 2 is thus detached from the circuit board 1 to permit replacement thereof with a new one.

It should be noted that, the cover member 4 and the operating member 5 may be disposed on the circuit board 1 at a suitable position above the base member 3 and the electronic device 2 only when the electronic device 2 is to be detached. Preferably, the circuit board 1 is provided with means for engaging a lower end of the support wall 42 so as to position the cover member 4 during operation of the operating member 5.

Accordingly, with the use of the ejector mechanism of the present invention, the electronic device 2 can be easily pulled away from the electrical connector 11 for disengaging the same by simply operating the operating lever 52. Moreover, adjacent electronic devices can be prevented from being damaged due to accidental collision during detachment of the electronic device 2.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

We claim:

1. An ejector mechanism adapted for pulling an electrical mating end portion of an electronic device in a first direction away from an electrical connector that is provided on a circuit board, said ejector mechanism comprising:

a base member adapted for retaining the electronic device thereon, said base member having a rear end distal to the electrical mating end portion of the electronic device in the first direction and formed with an upwardly extending engaging flange that extends in a second direction transverse to the first direction;

a cover member disposed above said base member and cooperating with said base member so as to be adapted to confine the electronic device therebetween, said cover member having a pivot portion disposed above said engaging flange; and an elongated operating member extending in the second direction and mounted pivotally on said pivot portion of said cover member about a pivot axis, said operating member having a hook projection which defines a downwardly opening engaging groove for receiving said engaging flange therein, said operating member being rotatable about the pivot axis to enable said hook projection to apply a pulling force in the first direction at said engaging flange, thereby resulting in corresponding movement of said base member in the first direction so as to be adapted to disengage the electrical mating end portion of the electronic device from the electrical connector on the circuit board.

2. The ejector mechanism according to claim 1, wherein said base member includes a base plate adapted for seating of the electronic device thereon, said engaging flange being formed on said base plate.

3. The ejector mechanism according to claim 2, wherein said base member further includes a pair of upwardly extending lateral walls that extend respectively from opposite lateral edges of said base plate, and screw fasteners that extend through said lateral walls and that are adapted to engage the electronic device so as to retain the electronic device on said base member.

4. The ejector mechanism as claimed in claim 1, wherein said operating member includes a pivot shaft mounted pivotally on said pivot portion of said cover member about said pivot axis, and an operating lever that extends in the second direction outwardly of said cover member.

5. The ejector mechanism as claimed in claim 4, wherein said cover member includes a cover plate formed with a pair of pivot lobes that extend downwardly from said cover plate and that are spaced apart in the second direction to serve as said pivot portion, said pivot lobes being formed with aligned pivot holes through which said pivot shaft of said operating member extends.

* * * * *